United States Patent [19]

Dersch

[11] Patent Number: 5,038,127

[45] Date of Patent: Aug. 6, 1991

[54] PROCESS FOR REDUCING EDDY CURRENTS IN A SUPERCONDUCTOR STRIP, AND A SUPERCONDUCTOR ARRANGEMENT

[75] Inventor: Helmut Dersch, Würenlos, Switzerland

[73] Assignee: Asea Brown Boveri Ltd., Baden, Switzerland

[21] Appl. No.: 537,112

[22] Filed: Jun. 13, 1990

[30] Foreign Application Priority Data

Jun. 14, 1989 [CH] Switzerland .................. 2229/89

[51] Int. Cl.$^5$ .............................................. H01F 7/22
[52] U.S. Cl. .................................. 335/216; 174/125.1; 505/1
[58] Field of Search ..................... 335/216, 299; 174/125.1; 505/1

[56] References Cited

U.S. PATENT DOCUMENTS 4,851,799  7/1989  Hilal ................................ 335/216
4,873,503  10/1989  Mansfield ......................... 335/216

Primary Examiner—George Harris
Attorney, Agent, or Firm—Burns, Doane, Swecker & Mathis

[57] ABSTRACT

An arrangement of electrically anisotropic high-temperature superconductors (A1, A2) on a non-superconducting metal strip (1) for alternating-current applications, such as magnets and electrical machines, is specified in the case of which a relatively simple reduction of alternating-current losses is achieved in that at least one strip (A1, A2), deposited as a layer, made of a high-temperature superconductor, spirally surrounds this metal strip. The superconducting strip (A1, A2) has a preferred direction in which the critical current density is smaller than in all other directions. In this arrangement, a current (i) flowing through the superconductor flows periodically through regions of the superconductor (A1, A2) that are oriented in the preferred direction and twisted by 180° thereto. These periodic regions limit the length of the eddy currents.

Instead of a spiral winding (A1, A2), it is also possible to use, especially for power cables, a two-layer conductor with grooves and webs arranged periodically along the current direction, in the case of which grooves and webs the current direction, in the case of which grooves and webs the current must alternate periodically from one into the other layer.

10 Claims, 1 Drawing Sheet

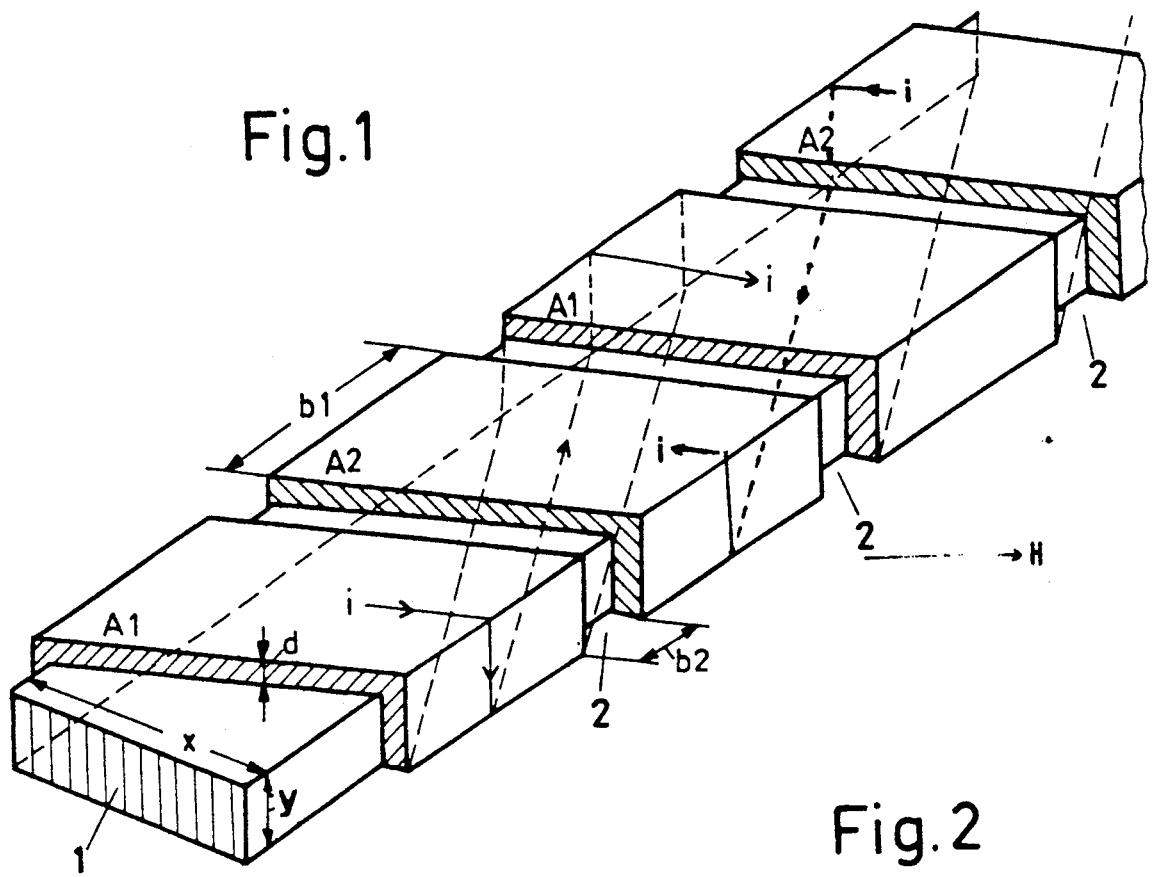
Fig. 1
Fig. 2
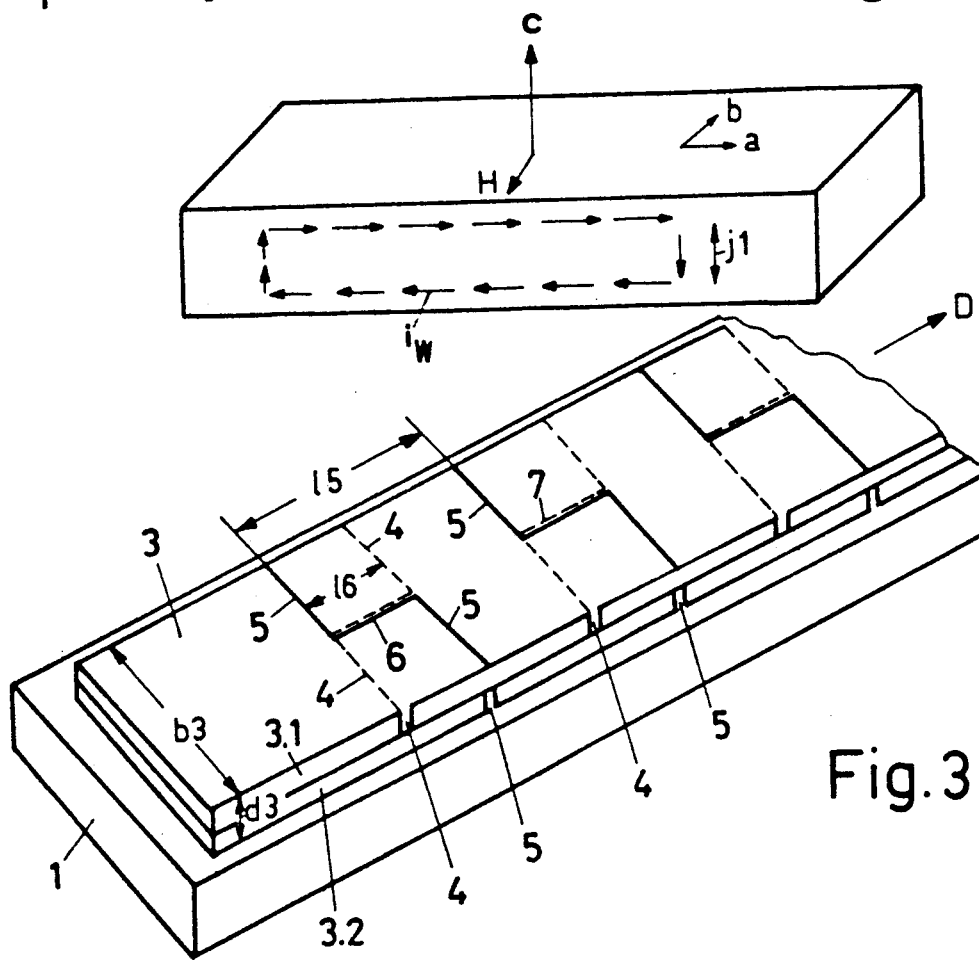
Fig. 3

PROCESS FOR REDUCING EDDY CURRENTS IN A SUPERCONDUCTOR STRIP, AND A SUPERCONDUCTOR ARRANGEMENT

BACKGROUND OF THE INVENTION

1. Field of the invention

The invention proceeds from a process for reducing eddy currents in a superconductor strip the preamble of patent claim 1, and from a superconductor arrangement according to the preamble of patent claim 2.

2. Discussion of background

In the respective preamble, the invention relates to a prior art as it is known from DE-C2-2,654,924. In order to overcome the disadvantage of brittleness with respect to mechanical stresses, a strip-like conductor or compound wire, around which a superconducting layer of $Nb_3Sn$ around strip of Nb is arranged, has been proposed. A stabilizing layer of copper or of a copper alloy is arranged around the superconducting layer, a layer, usually soldered, being arranged between the superconducting layer and the stabilizing layer. An outermost insulating layer is arranged around the stabilizing layer. It is given as disadvantageous that the strip has an instability in the form of a flux jump due to a non-uniform magnetic field, which is caused by geometrical anisotropy and leads to problems in the development of a magnet. Furthermore, it is known to wind individual compound cables around a rectangular or round tube of a stabilizing and/or a reinforcing material. In order, in the case of alternating current applications, to avoid disadvantageous effects due to a coupling current, the superconducting cores or strands are twisted together. A coupling current can also be reduced by providing a different conductivity for the respective cores. Furthermore, an increased contact resistance between the relevant cores can avoid a loop of the coupling current in an effective way. In order to avoid eddy-current losses, it is provided that a stabilizing metal, such as copper, is used in an insulated and mutually separated state, instead of in a continuous, solid form. It can also be provided that the copper is subdivided by a material of high electrical resistance into individual sections.

The disadvantage of this is the relatively expensive production of compound cables.

Concerning the relevant state of the art, reference may further be made to a publication by T. R. Dinger et al., Direct Observation of Electronic Anisotropy in Single-Crystal $Y_1Ba_2Cu_3O_{7-x}$, in the Americal journal: Physical Review Letters, Vol. 58, Nr. 25, 22.6.1987, pages 2687-2690. There is a description in that reference of the electrical behavior of anisotropic high-temperature oxide superconductors, which have a smaller critical current density in a specific direction than in all other directions.

Production of orientated films of high-temperature superconductors is known from a publication by S.Jin et al., High critical currents in Y-Ba-Cu-O superconductors, in the American journal: Appl. Phys. Lett. 52. (24), 13.6.1988, pages 2074 to 2076.

SUMMARY OF THE INVENTION

Accordingly, one object of this invention, is to achieve the object of specifying a process and a superconductor arrangement of the type mentioned at the beginning, which guarantees in a simpler fashion a reduction of alternating-current losses in the case of high-temperature superconductors.

An advantage of the invention consists in that in the case of conductors for applications in externally predetermined magnetic fields (transformer, generator, machine etc.), the eddy currents are limited to a short length of the conductor. This is achieved by periodic twisting of the crystal planes. There is no need for compound superconductors, which are expensive to produce, with thin superconducting filaments, which must be embedded in a metal matrix and twisted, in order to avoid coupling losses between the filaments.

The electrical anisotropy of high-temperature superconductors, which up to now has been regarded as an obstacle to their technical application, is exploited here.

BRIEF DESCRIPTION OF THE DRAWINGS re complete appreciation of the invention and many of the attendant advantages thereof will be readily obtained as the same becomes better understood by reference to the following detailed description when considered in connection with the accompanying drawings, wherein:

FIG. 1 shows a schematic representation of a section of a metal carrier, which is coated spirally with two strips made of an electrically anisotropic high-temperature superconductor;

FIG. 2 shows a representation of the eddy currents in an electrically anisotropic high-temperature superconductor and FIG. 3 shows a two-layer conductor made of an electrically anisotropic high-temperature superconductor, which is applied to a metal strip, and has ribs or grooves at periodic intervals for delimitation of eddy currents.

DESCRIPTION OF THE PREFERRED EMBODIMENTS

Referring now to the drawings, wherein like reference numerals designate identical or corresponding parts throughout the several views, in FIG. 1 a cuboid carrier or substrate (1), represented in principle by a section and made of metal plate, has a width, (x) in the region of 0.2 cm–10 cm, preferably in the region of 2 cm–3 cm, and a thickness (y) in the region of 0.05 mm–2 mm, preferably in the region of 0.4 mm–0.6 mm. This carrier (1) is coated spirally with two bifilar strips (A1) and (A2) made of an electrically anisotropic high-temperature oxide superconductor, such as, e.g., $YBa_2Cu_3O_{7-x}$. The layer thickness (d) of these strips (A1, A2) is smaller than their width (b1). Located between neighboring strips (A1) and (A2) is an interval or a groove (2) of a width (b2) in the region of 0.1 mm–1 mm. Consequently, a current denoted by (i) is forced to circle the carrier (1) spirally, to be precise upwards and to the right in the strip (A1) and in the opposite direction downwards to the left in the strip (A2) in the representation in accordance with FIG. 1. By coating this structure with two identical strips, through which the current (i) flows in the opposite direction, it is possible to avoid undesired inductances.

The coating with the superconductor is done in such a way that the crystallographic c-axis of the material everywhere forms an angle of 90°±5° with the surface of the substrate (1). A suitable process is described in the publication by S. Jin et al. mentioned at the beginning.

FIG. 2 shows, diagrammatically, an electrically anisotropic high-temperature superconductor having a preferred direction (c), in which and in the opposite direction to which the critical current density (j1) is smaller than in all other directions (a, b). Arrows indicate an eddy current (iw), which flows in a plane perpendicular to the direction of a magnetic field (H) in the superconductor. A smaller conductivity in the direction of the critical current density (j1) limits the strength of the eddy currents.

In the case of application, the superconductor arrangement in accordance with FIG. 1 is positioned with respect to the magnetic field (H) in such a way that the narrow side faces of the carrier (1) are located in a vertical position of 90°±5° to the magnetic field. In the region of the wide faces of the carrier (1), eddy currents (iw) in the superconductor strips (A1, A2) flow alternately through regions in this preferred direction (c) and periodically through regions that are oriented oppositely thereto, i.e. are rotated by 180°. In the region of the narrow side faces of the carrier (1), eddy currents (iw) flow in the plane (a, b), so that here the desired effect of reducing the eddy currents does not appear.

FIG. 3 shows another embodiment of the invention, in which an electrically anisotropic superconducting layer (3) or a superconducting two-layer conductor (3), which can be perceived as composed of two layers (3.1) and (3.2) of equal thickness, but actually consists of one layer, is deposited on a non-superconducting carrier (1). The superconducting layer (3) has a width (b3) in the region of 2 cm–3 cm and a thickness (d3) in the region of 0.01 mm–1 mm, preferably in the region of 0.1 mm–0.4 mm. Provided in the longitudinal direction (D) of the layer (3) are, at identical or periodic intervals (15) in the lower half layer (3.2), non-superconducting separation zones, i.e. webs or recesses or grooves (5), which project from the supporting surface into the layer (3) by as much as half the thickness, and provided in the upper half layer (3.1) there are non-superconducting separation zones, i.e. webs or recesses or grooves (4), which project from the upper face of the layer (3) as far as the center of the layer or by up to half the thickness of the layer in the latter. Seen from the surface, webs and grooves (4, 5) are constructed in the form of seats or steps, with in each case a non-superconducting separation zone, i.e. a longitudinal web or a longitudinal groove (6) in the lower half layer (3.2), and a non-superconducting separation zone extending parallel thereto, i.e. a longitudinal web or a longitudinal groove (7) in the upper half layer (3.1) in the longitudinal direction (D) in the middle of the layer (3). Overall, the webs or grooves (4, 5) belonging to one period or one step have the form of an H, the web drawn with dashes or the groove (4) extending only in the upper half of the superconducting layer (3), and the web drawn with a through line or the groove (5) extending only in the lower half of the superconducting layer (3). What has been said above applies with reference to the c-axis. In the crossbar of the H, the superconducting separation zone (6, 7) reaches through the entire superconducting layer (3). The width of the non-superconducting separation zones, webs or grooves (4–7) is $\leq 0.5$ mm.

The carrier (1) is 2 cm–3 cm wide, 0.1 mm–2 mm thick, and over 1 km long as the case may be.

Instead of this two-strip conductor, it would also be possible to provide a single-layer conductor (not represented), in which the c-axis of the applied superconductor is twisted periodically by 180°. In this process, the c-axis and the substrate surface form an angle of 90°±5° and 270°±5°, which varies between these two values periodically with a period of width (x) plus thickness (y) of the substrate (1).

The superconductor arrangement represented in FIG. 3 is particularly suitable as a conductor (cable) for current transfer, in which only the proper field losses have to be reduced. Here, twisting is simulated by a two-layer conductor, in which the current-carrying layers are periodically interchanged. The c-axis of the applied superconductor is oriented perpendicular to the surface of the layer (3). The effect of the grooves and webs (4, 5) is that each current path alternates periodically between the upper layer (3.1) and lower layer (3.2). Since it is a typical feature of proper fields of the current that they have a different, opposing direction in the plane of the upper layer (3.1) and lower layer (3.2), eddy currents are effectively limited to the length (15) of the periodic interval of the webs (5).

It is important that eddy currents are limited to a length in the superconductor which is less than a critical length $1_c$, where $$1_c = 4\ ((r\cdot\rho\cdot j_c)/(dB/dt))^{\frac{1}{2}}.$$

$\rho$ = electrical resistance of the superconductor in the c-direction upon overshooting of the critical current density in this direction, r = half strip thickness, $j_c$ = critical current density in the a,b-direction, B = magnetic induction, and t = time for effective suppression of coupling losses. In this regard, the c-direction of the superconducting layer (A1, A2) must be aligned overwhelmingly perpendicular to the magnetic field (H). Otherwise, eddy currents which lead to higher losses are induced in the a-b plane. In the case of the arrangement in the case of FIG. 1, the interval must be $2\cdot b1 + b2 \leq 1_c$. With the arrangement in accordance with FIG. 3, we must have $15 \leq 1_c$.

Obviously, numerous modifications and variations of the present invention are possible in light of the above teachings. It is therefore to be understood that within the scope of the appended claims, the invention may be practiced otherwise than as specifically described herein.

WHAT IS CLAIMED AS NEW AND DESIRED TO BE SECURED BY LETTERS PATENT OF THE UNITED STATES IS:

1. A process for reducing eddy currents in at least one anisotropic current-carrying superconductor strip (A1, A2, 3)
   a) which in a preferred direction (c) has a smaller critical current density (j1) than in all other directions (a, b), and
   b) is applied as a layer on a non-superconducting substrate (1)

wherein
   c) the eddy currents generated in the superconductor strip are conducted segmentally at periodic intervals, which are smaller than a predeterminable critical length ($1_c$), through regions of the superconductor strip that are oriented in the preferred direction (c) of the superconductor and oppositely thereto (180°), it being the case that it holds for the critical length that:

$$1_c = 4\ ((r\cdot\rho\cdot j_c)/(dB/dt))^{\frac{1}{2}}.$$

$\rho$ = electrical resistance of the superconductor in the c-direction upon overshooting of the critical current density in this direction, r = half strip thickness, $j_c$ = critical current density in an a,b-direction perpendicular to the c-direction, B=magnetic induction, and t=time.

2. A superconductor arrangement with at least one anisotropic superconductor strip (A1, A2, 3),
   a) which has in a preferred direction (c) a smaller critical current density (j1) than in all other directions (a, b) and
   b) is applied on a non-superconducting substrate (1) as a layer,
   c) the preferred direction (c) and the substrate surface forming an angle of 90°±5°,
wherein,
   d) in the direction of a current flowing through the superconductor strip, the superconductor strip has, at periodic intervals (2 b1+b2; 15) after one another, current flow regions of normal current density followed by current flow regions with a smaller critical current density (j1), it being the case that these intervals ≦ a critical length ($l_c$), for which it holds that:

$$l_c = 4\ ((r \cdot \rho \cdot j_c)/(dB/dt))^{\frac{1}{2}},$$

$\rho$=electrical resistance of the superconductor in the c-direction upon overshooting of the critical current density in this direction, r=half strip thickness, $j_c$=critical current density in an a,b-direction, perpendicular to the c-direction, B=magnetic induction, and t=time.

3. The superconductor arrangement as claimed in claim 2, wherein
   a) at least one superconductor strip (A1, A2) surrounds the substrate (1) spirally, and
   b) the substrate (1) is constructed in an essentially rectangular fashion in cross-section, its width (x) being larger than its thickness (y).

4. The superconductor arrangement as claimed in claim 3, wherein
   a) the substrate (1) has a width (x) in the region of 1 cm-5 cm, and
   b) a thickness (y) in the region of 0.1 mm-2 mm.

5. The superconductor arrangement as claimed in claim 3, wherein
   a) the substrate (1) has a width (x) in the region of 2 cm-3 cm, and
   b) a thickness (y) in the region of 0.4 mm-0.6 mm.

6. The superconductor arrangement as claimed in claim 3, wherein neighboring windings of the at least one superconductor strip (A1, A2) have a mutual predeterminable strip interval (b2) in the region of 0.1 mm-1 mm.

7. The superconductor arrangement as claimed in claim 2, wherein
   a) the superconducting layer (3) has non-superconducting separation zones, grooves or webs (5) periodically offset at a predeterminable interval (15) in the longitudinal direction (D), which project from the supporting side of the superconducting layer (3) into this superconducting layer, and
   b) said layer (3) has separation zones, grooves or webs (4), which are periodically non-superconducting at this predeterminable interval (15) and extend from the surface of the superconducting layer (3) into this layer.

8. The superconductor arrangement as claimed in claim 7, wherein
   a) the non-superconducting separation zones, grooves or webs (4, 5) extend alternately perpendicularly to the longitudinal direction (D) of the superconducting layer (3) up to the middle of this layer in each case, and
   b) separation zones, longitudinal grooves or longitudinal webs (6, 7) which are non-superconducting over a segment (15) of predeterminable length, extend in the middle in the longitudinal direction (D) of the layer (3)
   c) in the entire thickness (d3) of the superconducting layer (3).

9. The superconductor arrangement as claimed in claim 7, wherein
   a) the superconducting layer (3) has a width (b3) in the region of 2 cm-3 cm and
   b) a thickness (d3) in the region of 0.01 mm-1 mm,
   c) particularly of 0.1 mm-0.4 mm, and
   d) the non-superconducting separation zone, groove or web (4-7) has a width of ≦0.5 mm.

10. Superconductor arrangement as claimed in claim 7, wherein the non-superconducting separation zones, grooves or webs (4) which project from the surface of the superconducting layer (3) into the latter, and the non-superconducting separation zones, grooves or webs (5) which project from the underside of the supporting surface of the superconducting layer (3) into the latter are constructed in each case in the form of seats or steps in such a way that together they have the form of an H, the crossbar of the H being formed by the non-superconducting separation zones, longitudinal grooves or longitudinal webs (6, 7) extending in the longitudinal direction (D) of the superconducting layer (3).

* * * * *